United States Patent [19]

Motonobu et al.

[11] Patent Number: 5,479,329
[45] Date of Patent: Dec. 26, 1995

[54] SWITCHING POWER SUPPLY HAVING OUTPUT TERMINAL DISCONNECTION DETECTING CIRCUIT

[75] Inventors: Masahiro Motonobu; Koichi Ueki; Yasuo Kobayashi, all of Kanagawa, Japan

[73] Assignee: Fuji Electric Co., Ltd., Kawasaki, Japan

[21] Appl. No.: 389,455

[22] Filed: Feb. 16, 1995

[30] Foreign Application Priority Data

Feb. 25, 1994 [JP] Japan ................................ 6-027778

[51] Int. Cl.$^6$ ........................ H02M 3/00; H02M 3/335
[52] U.S. Cl. ..................... 363/15; 363/19; 363/21
[58] Field of Search ........................ 363/15, 19, 21, 363/23, 25, 55, 78, 95; 323/282, 284, 909; 361/18, 91

[56] References Cited

U.S. PATENT DOCUMENTS

| | | | |
|---|---|---|---|
| 4,603,288 | 7/1986 | Rogers | 323/234 |
| 5,091,837 | 2/1992 | Duspiva et al. | 363/15 |
| 5,383,106 | 1/1995 | Yoshida et al. | 363/15 |
| 5,406,468 | 4/1995 | Booth | 363/21 |
| 5,408,402 | 4/1995 | Nonnenmacher | 363/21 |
| 5,412,555 | 5/1995 | Uramoto | 363/18 |

Primary Examiner—Matthew V. Nguyen
Attorney, Agent, or Firm—Kanesaka & Takeuchi

[57] ABSTRACT

In a switching power supply, electric current is supplied through a switching device to a load located away from the switching power supply. The electric current at the load is detected by a remote detecting device at remote detecting terminals. The remote detecting device includes a differential amplifier and a comparator connected to an output terminal of the differential amplifier. The comparator compares an output voltage of the differential amplifier with a reference voltage and outputs an alarm signal when the output voltage of the differential amplifier is lower than the reference voltage. A control device is connected to the switching device, the output terminal of the remote detecting device and a first reference voltage supply device. The control device changes ON-OFF duty ratio of the switching device by comparing the output voltage of the differential amplifier with the first reference voltage to control an output voltage of the switching device at a predetermined value. A first overvoltage protecting device is connected to the control device for protecting the load from overvoltage by monitoring the output of the switching device.

6 Claims, 4 Drawing Sheets

SWITCHING POWER SUPPLY HAVING OUTPUT TERMINAL DISCONNECTION DETECTING CIRCUIT

BACKGROUND OF THE INVENTION AND RELATED ART STATEMENT

The present invention relates to a switching power supply formed of a DC/DC converter, and more specifically, to a switching power supply which supplies an output voltage of the DC/DC converter through wiring to a load located away from the DC/DC converter and controls the output voltage of the DC/DC converter at a constant value by remotely detecting a terminal voltage of the load.

This kind of a DC/DC converter according to the prior art is explained with reference to FIG. 4, which is a block diagram of the DC/DC converter according to the prior art.

In FIG. 4, a symbol SW designates a DC/DC converter; E is a direct voltage source; and L is a load located away from the DC/DC converter SW. The DC/DC converter SW comprises a switching portion 1 which switches on and off an electric current of the direct voltage source E by switching elements, such as transistors, thyristors, etc. and supplies the electric current switched on and off to a transformer 2; a rectifying and smoothing portion 3 which rectifies and smooths an output voltage of a secondary side of the transformer 2 electrically insulated from the direct voltage source E; output terminals T1, T2 from which an output voltage of the rectifying and smoothing portion 3 is supplied through distribution wires L1, L2 to the load L; remote detecting terminals T3, T4 from which a voltage between terminals of the load L is remotely detected through detecting leads L3, L4; a remote output voltage detecting portion (hereinafter referred to as "remote detecting portion") 4 formed of a voltage dividing circuit and so on, which detects a voltage applied between the remote detecting terminals T3, T4; an error amplifying portion 5 which amplifies a difference between an output voltage of the remote detecting portion 4 and a reference voltage from the first reference voltage generating portion 6; a comparing portion 7 which compares a voltage difference from the error amplifying portion 5 with a signal corresponding to ON-OFF duty ratio of the switching portion 1; an oscillating portion 8 which changes the ON-OFF duty ratio of the switching portion 1 based on an output from the comparing portion 7 and supplies the changed ON-OFF duty ratio to the switching portion 1; and an overvoltage protecting portion 9 which is connected to the positive voltage side of the rectifying and smoothing portion 3 through a resistor 10, and stops supply of the signal from the oscillating portion 8 to the switching portion 1 by detecting the overvoltage based on the output voltage of the rectifying and smoothing portion 3. The error amplifying portion 5, the comparing portion 7 and the oscillating portion 8 constitute a control portion for changing the ON-OFF duty ratio of the switching portion 1. A resistor R20 is connected between the negative output voltage side of the rectifying and smoothing portion 3 and the negative input voltage side of the remote detecting portion 4.

In the switching power supply of FIG. 4, as known already, the electric current of the direct voltage source E is switched on and off in the switching portion 1 and the electric current switched on and off is supplied to the primary side of the transformer 2. The alternating voltage generated on the secondary side of the transformer 2 is rectified and smoothed in the rectifying and smoothing portion 3, and the direct voltage is supplied to the load L from the rectifying and smoothing portion 3 via the output terminals T1, T2. The voltage between the terminals of the load L is applied to the remote detecting terminals T3, T4 through the detecting leads L3, L4 and is detected in the remote detecting portion 4. The voltage difference between the output voltage from the remote detecting portion 4 and the reference voltage from the first reference voltage generating portion 6 is supplied from the error amplifying portion 5 to the comparing portion 7, and the supplied voltage difference is compared in the comparing portion 7 with the signal corresponding to the ON-OFF duty ratio in the switching portion 1.

The comparing portion 7 controls, in response to the voltage difference supplied from the error amplifying portion 5, ON-OFF duty ratio of the pulse signal fed from the oscillating portion 8 to the switching portion 1. Based on the controlled ON-OFF duty ratio of the pulse signal, magnitude or amount of the electric power supplied from the switching portion 1 is changed, and the output voltage from the DC/DC converter SW is controlled at a predetermined constant value.

In the prior art shown in FIG. 4, in case the detecting leads L3 or L4 of the load L connected to the remote detecting terminal T3 or T4 of the DC/DC converter is disconnected, the disconnection of the detecting leads L3 or L4 can not be detected. When the detecting lead L3 or L4 is disconnected, the output voltage of the DC/DC converter SW is only supplied to the remote detecting portion 4 through the resistors R10, R20. In this case, since the output voltage of the DC/DC converter is higher than the voltage between the terminals of the load L for the amount of the voltage drop through the distribution wires L1, L2, the control portion operates to lower the ON-OFF duty ratio of the switching portion 1, so that the voltage practically supplied to the load L is lowered.

In view of the foregoing, an object of the present invention is to obviate the defects of the prior art and to provide a switching power supply which can detect disconnection of the distribution wires of the load connected to the remote detecting terminals.

Another object of the present invention is to provide a switching power supply which can keep the output voltage at a predetermined constant value suitable for the load even when the distribution wire of the load connected to the remote detecting terminal is disconnected.

SUMMARY OF THE INVENTION

In a first aspect of the present invention, a switching power supply comprises a transformer; switching means for switching on and off an electric current of a direct voltage source and for supplying the electric current switched on and off to the transformer; rectifying and smoothing means for rectifying and smoothing an output voltage of the transformer; remote detecting terminals connected to terminals of a load to which an output of the rectifying and smoothing means is applied; remote detecting means connected to the remote detecting terminals for detecting a voltage between the terminals of the load; control means for changing ON-OFF duty ratio of the switching means by comparing an output voltage of the remote detecting means with a first reference voltage and for controlling an output voltage of the switching means at a predetermined constant value; and first overvoltage protecting means for protecting the load from overvoltage by monitoring the output of the rectifying and smoothing means. The remote detecting means is formed of a differential amplifier having an inverse terminal and a non-inverse terminal connected to each of the remote detecting terminals, and an output terminal connected to the control means; and a comparator for comparing an output of the differential amplifier with a reference voltage and for outputting an alarm signal when the output of the differential amplifier is lower than the reference voltage.

In a second aspect of the present invention, a switching power supply comprises a transformer; switching means for switching on and off an electric current of a direct voltage source and for supplying the electric current switched on and off to the transformer; rectifying and smoothing means for rectifying and smoothing an output voltage of the transformer; remote detecting terminals connected to terminals of a load to which an output of the rectifying and smoothing means is applied; remote detecting means connected to the remote detecting terminals for detecting a voltage between the terminals of the load; control means for changing ON-OFF duty ratio of the switching means by comparing an output voltage of the remote detecting means with a first reference voltage and for controlling an output voltage of the switching means at a predetermined value; and first overvoltage protecting means for protecting the load from overvoltage by monitoring the output of the rectifying and smoothing means. The remote detecting means is formed of a differential amplifier having an inverse terminal and a non-inverse terminal connected to each of the remote detecting terminals, and an output terminal connected to the control means; and a comparator for comparing an output of the differential amplifier with a reference voltage and for outputting an alarm signal when the output of the differential amplifier is lower than a reference voltage.

The switching power supply further includes first, second and third switching means changed over by the alarm signal outputted from the remote detecting means; output voltage detecting means for detecting the output of the rectifying and smoothing means; second reference voltage generating means for outputting a second reference voltage higher than the first reference voltage; and second overvoltage protecting means connected to the remote detecting terminals. The first switching means normally feeds the output voltage of the differential amplifier to the control means, and is changed over by the alarm signal to feed an output voltage of the output voltage detecting means to the control means. The second switching means normally feeds the first reference voltage to the control means, and is changed over by the alarm signal to feed a second reference voltage to the control means. The third switching means normally feeds an output of the second overvoltage protecting means to the control means, and is changed over by the alarm signal to feed an output of the first overvoltage protecting means to the control means.

In the first aspect of the invention, the remote detecting means connected to the remote detecting terminals is formed of the differential amplifier having the inverse terminal and the non-inverse terminal connected to each of the remote detecting terminals, and the output terminal connected to the control means; and the comparator for comparing the output of the differential amplifier with the reference voltage and for outputting an alarm signal when the output of the differential amplifier is lower than the reference voltage. Thus, disconnection of the detecting leads for the load is detected by vanishing of the voltage applied to the remote detecting terminal, and the alarm signal is outputted.

In the second aspect of the invention, the switching power supply detects the disconnection of the leads to the remote detecting terminals by the remote detecting means, as in the first aspect of the invention. The switching power supply further includes the first, second and third switching means changed over by the alarm signal outputted from the remote detecting means. The first switching means normally feeds the output of the differential amplifier to the control means, and is changed over by the alarm signal to feed the output voltage of the output voltage detecting means to the control means. The second switching means normally feeds the first reference voltage to the control means, and is changed over by the alarm signal to feed the second reference voltage to the control means. The third switching means normally feeds the output of the second overvoltage protecting means to the control means, and is changed over by the alarm signal to feed the output of the first overvoltage protecting means to the control means. Thus, when the distribution wire of the load connected to the remote detecting terminals is disconnected, power supply is continued to the load based on the output voltage of the rectifying and smoothing means, and changes over the reference voltage fed to the control means to a reference voltage which considers voltage drop through the distribution wires to the load. Also, the overvoltage is protected based on the output of the rectifying and smoothing means.

DETAILED DESCRIPTION OF PREFERRED EMBODIMENTS

Now the present invention will be described in detail hereinafter with reference to accompanied drawings which illustrate the preferred embodiments of the present invention.

Figure 1:
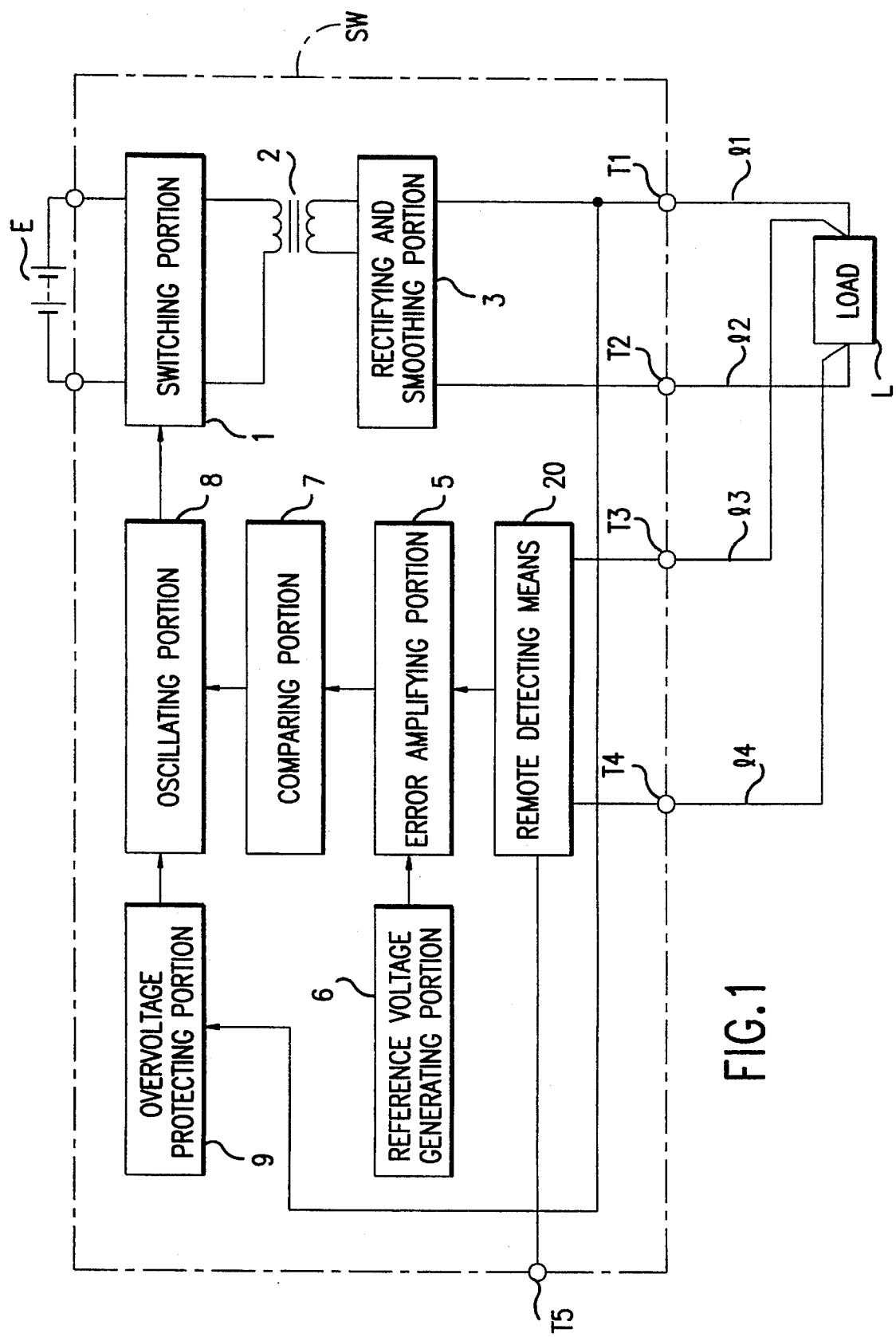
FIG. 1 is a block diagram showing an embodiment of a switching power supply according to the present invention.
Figure 4:
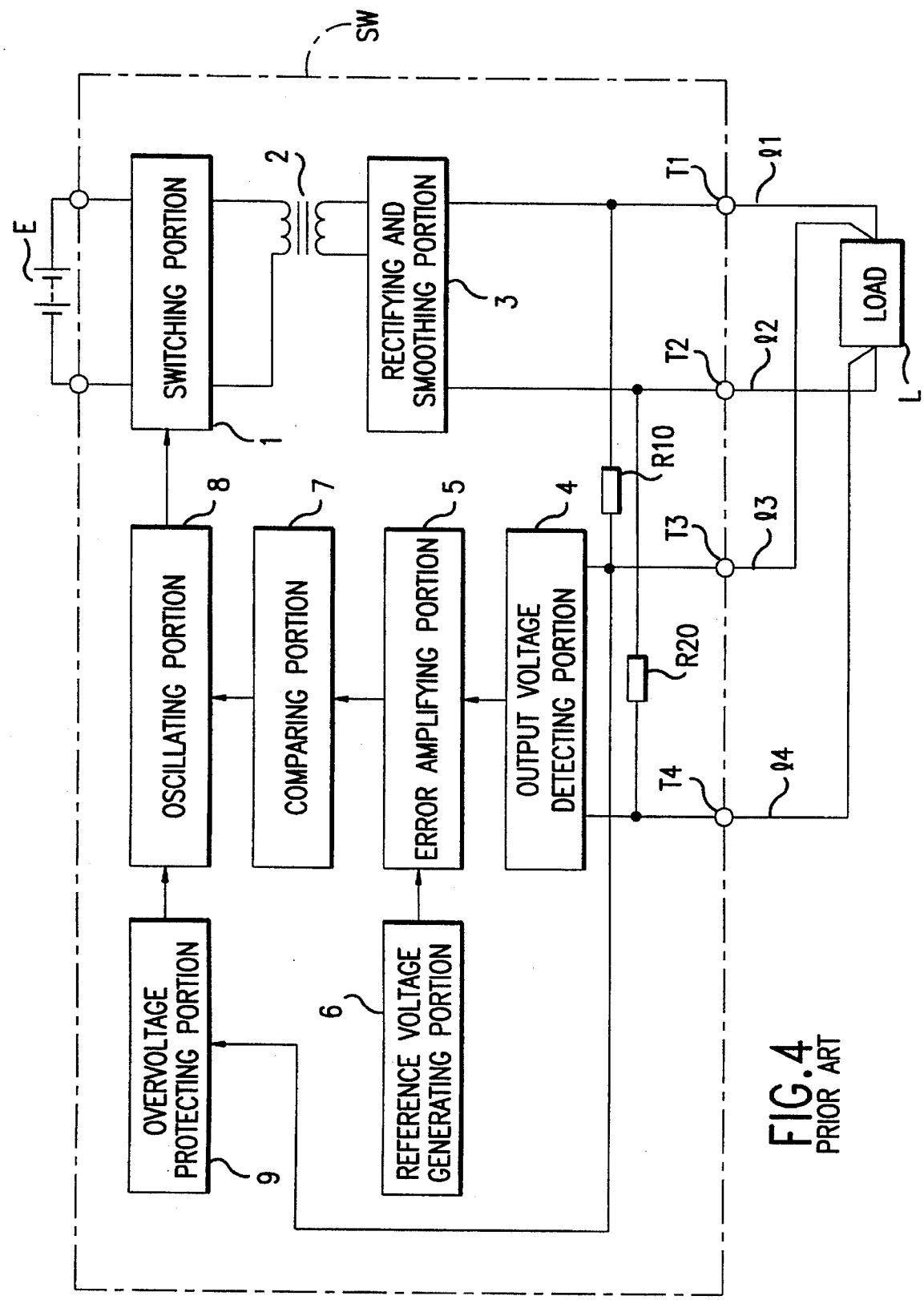
FIG. 4 is a block diagram showing a switching power supply according to the prior art.

FIG. 1 is a block diagram showing an embodiment of the switching power supply according to the present invention. In FIG. 1, the same constituents or members with those of FIG. 4 are designated by the same reference numerals and their explanations are omitted.

The switching power supply of FIG. 1 is different from the conventional switching power supply of FIG. 4 in that the switching power supply of FIG. 1 is provided with remote output voltage detecting means (hereinafter referred to as "remote detecting means") 20 for the substitution of the remote detecting portion 4 in FIG. 4. The remote detecting means 20 detects disconnection of the detecting lead L3 or L4 of the load L connected to the remote detecting terminal T3 or T4, and outputs an alarm signal to an alarm terminal T5.

Figure 2:
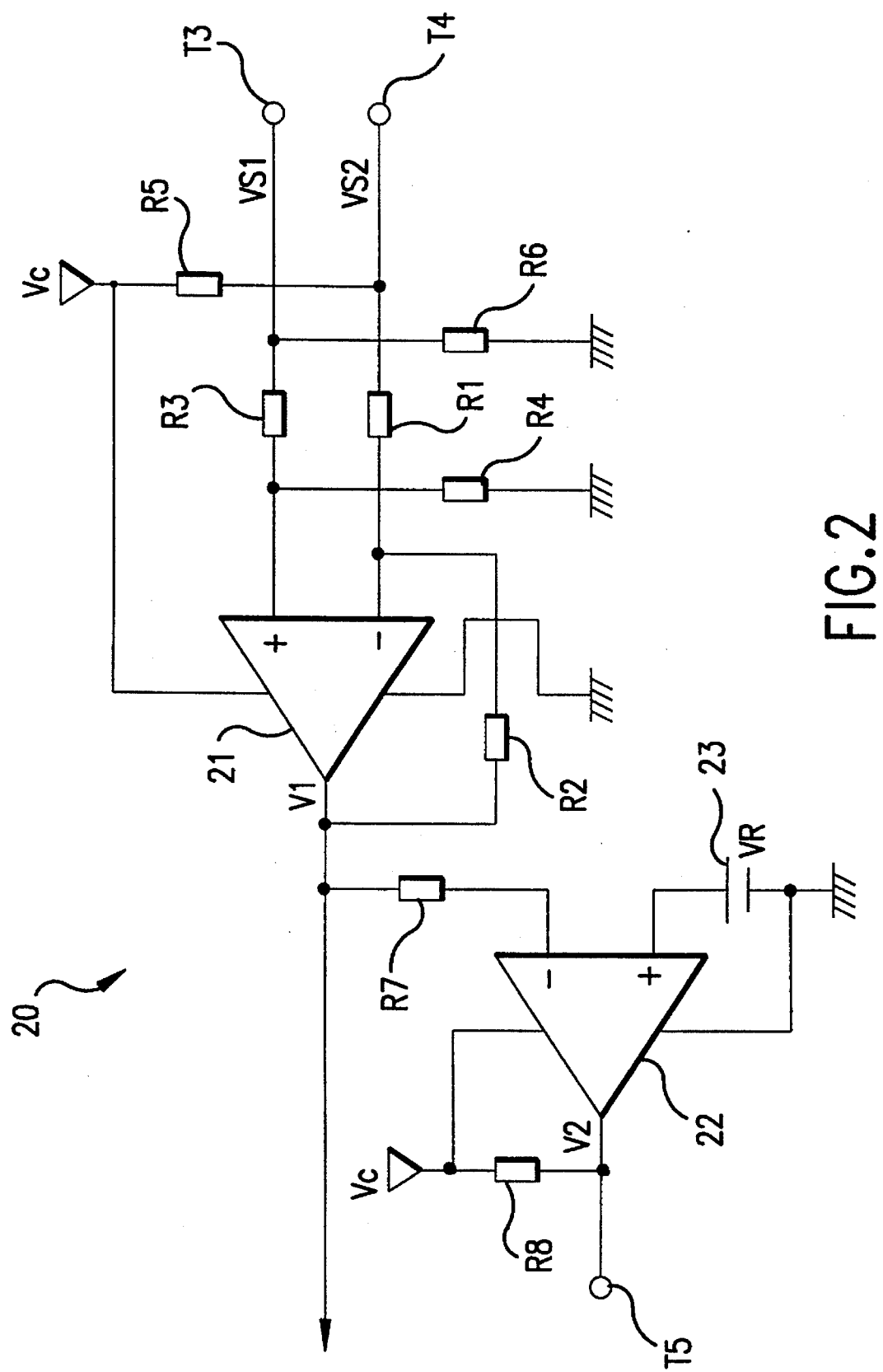
FIG. 2 is a circuit diagram of remote detecting means of FIG. 1.

FIG. 2 is a circuit diagram of the remote detecting means 20 shown in FIG. 1. In FIG. 2, the remote detecting terminal T3 is connected to a non-inverse input terminal of an operational amplifier 21 via a resistor R3, and the remote detecting terminal T4 is connected to an inverse input terminal of the operational amplifier 21 via a resistor R1.

Both ends of the resistor R3 are grounded via resistors R4, R6. Power is supplied to the operational amplifier 21 from a control power supply Vc. An end of a resistor R5 is connected to the control power supply Vc, and the other end of the resistor R5 is connected to a portion between the resistor R1 and the remote detecting terminal T4. An output terminal of the operational amplifier 21 is connected to its inverse input terminal via a resistor R2. The operational amplifier 21 and the resistors R1 to R4 constitute a differential amplifier. Hereinafter, the operational amplifier 21 will be referred to as "differential amplifier".

The differential amplifier 21 is connected via a resistor R7 to an inverse input terminal of a comparator 22 formed of an operational amplifier and to the error amplifying portion 5 shown in FIG. 1. A battery 23 is connected as a reference voltage source to a non-inverse input terminal of the comparator 22. Power is supplied to the comparator 22 from the control power supply Vc. An output of the comparator 22 is connected to the alarm terminal T5. A resistor R8 is connected between the control power supply Vc and an output terminal of the comparator 22. Resistance values of the resistors R1 and R3 are the same, and resistance values of the resistors R2 and R4 are the same.

The circuit shown in FIG. 2 operates as follows. In a state where the detecting leads L3 and L4 connected to the load L (see FIG. 1) are connected to the remote detecting terminals T3 and T4, the output voltage V1 of the differential amplifier 21 is expressed with the voltages VS1 and VS2 applied to the remote detecting terminals T3 and T4 as V1=(R2/R1)·(VS1−VS2). That is, the differential amplifier 21 outputs a signal at high level (hereinafter the signal at high level is simply referred to as "H signal") obtained by amplifying the difference of the voltages VS1 and VS2 of the remote detecting terminals T3 and T4 with the amplification factor (R2/R1) of the amplifier 21. The output voltage of the differential amplifier 21 is inputted to the inverse input terminal of the comparator 22, and thus, the output voltage of the comparator 22 becomes almost 0 V, because the output voltage of the differential amplifier 21 is the H signal and the reference voltage VR of the battery 23 is 0<VR<V1. That is, the comparator 22 outputs a signal at low level (hereinafter the signal at low level is referred to as "L signal"). Therefore, the signal outputted from the alarm terminal T5 is the L signal. Since the H signal from the differential amplifier 21 is fed to the inverse input terminal of the comparator 22 and to the error amplifying portion 5 (see FIG. 1), the switching power supply of FIG. 1 operates to keep its output voltage at a predetermined value.

When the detecting lead L3 of the load connected to the remote detecting terminal T3 is disconnected, the voltage applied to the non-inverse input terminal of the differential amplifier 21 is 0 V, since the non-inverse input terminal of the differential amplifier 21 is grounded via the resistors R6, R4. And, the voltage applied to the inverse input terminal of the differential amplifier 21 is expressed by (R2·Vc+(R1+R5)·V1)/(R1+R2+R5), since the inverse input terminal of the differential amplifier 21 is connected via the resistors R1, R5 to the control power supply Vc and via the resistor R2 to the output terminal of the differential amplifier 21. As a result, since the voltage applied to the inverse input terminal of the differential amplifier 21 becomes larger than the voltage applied to the non-inverse input terminal of the differential amplifier 21, the output voltage of the differential amplifier 21 becomes almost 0 V and changes from the H signal to the L signal.

When the output voltage V1 of the differential amplifier 21 changes from the H signal to the L signal, the output voltage V2 from the comparator 22 changes from the L signal to the H signal, since the voltage applied to the inverse input terminal of the comparator 22 becomes smaller than the reference voltage VR of the battery 23 applied to the non-inverse input terminal of the comparator 22. Thus, the H signal is outputted from the alarm terminal T5 for alarming the disconnection of the detecting lead L3 of the load L connected to the remote detecting terminal T3 by, for example, ringing a bell connected to the alarm terminal T5.

In the above, the explanation has been made to the disconnection of the detecting lead L3 for the load L connected to the remote detecting terminal T3. However, it is possible to detect the disconnection of the detecting lead L4 of the load L connected to the remote detecting terminal T4 or simultaneous disconnection of the detecting leads L3 and L4 in the similar way as explained above.

Figure 3:
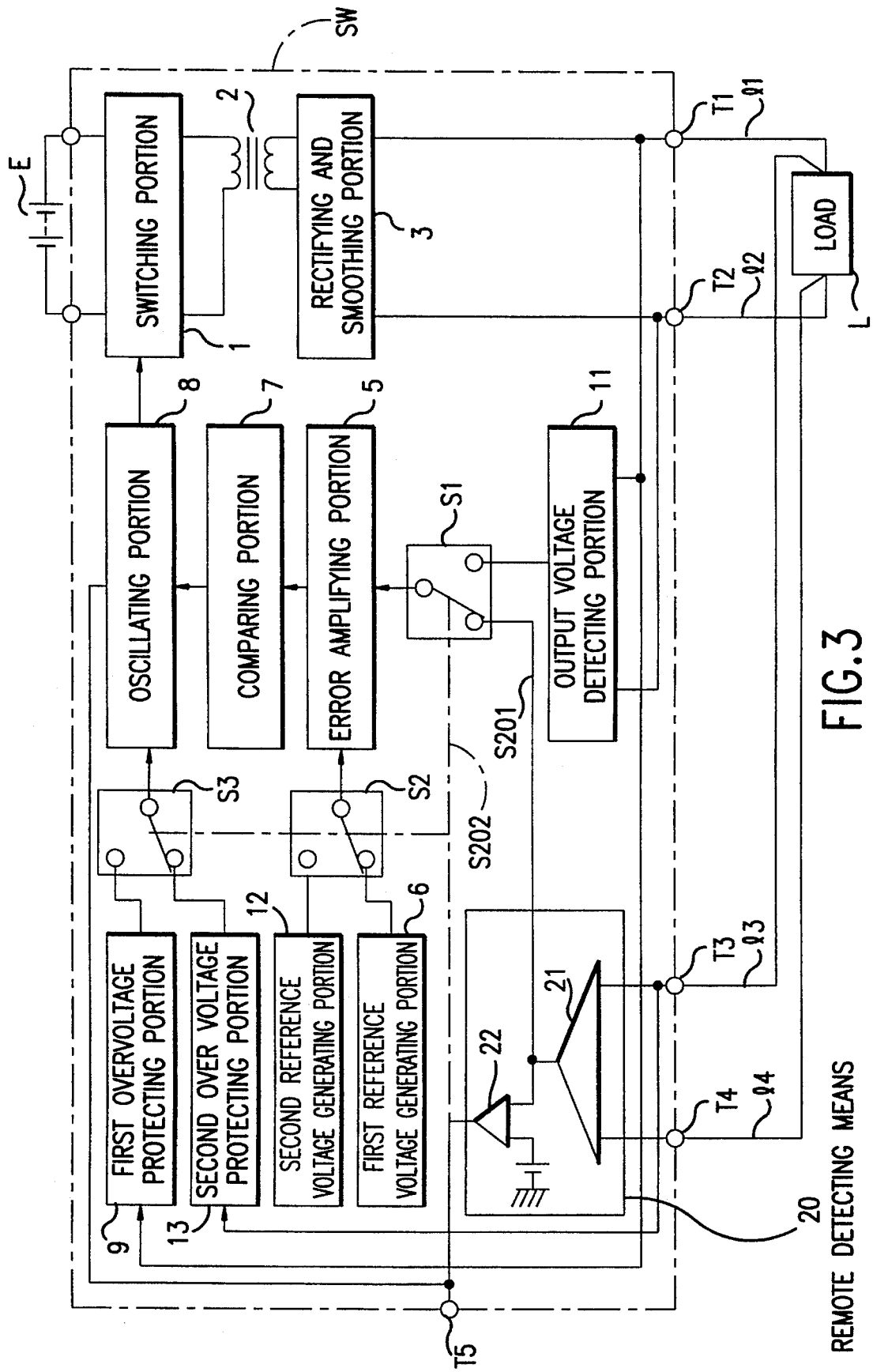
FIG. 3 is a block diagram showing another embodiment of a switching power supply according to the present invention.

Another embodiment of the switching power supply according to the present invention will be explained with reference to a block diagram shown in FIG. 3. In FIG. 3, the same constituents or members with those of FIG. 1 are designated by the same reference numerals, and their explanations will be omitted.

The switching power supply shown in FIG. 3 is different from the switching power supply of FIG. 1 in that the switching power supply of FIG. 3 is provided with an output voltage detecting portion 11 which detects the output voltage of the rectifying and smoothing portion 3, a second reference voltage generating portion 12 which outputs a higher reference voltage than the reference voltage outputted from the first reference voltage generating portion 6, a second overvoltage protecting portion 13 which detects overvoltage based on the input voltage of the remote detecting means 20, and first, second and third analog switches S1, S2 and S3 switched by the alarm signal from the remote detecting means 20. The analog switches S1, S2 and S3 constitute first, second and third switching means respectively.

The first analog switch S1 feeds normally, i.e. when the alarm signal from the remote detecting means 20 is the L signal, an output signal S201 of the differential amplifier 21 from the remote detecting means 20 to the error amplifying portion 5. The first analog switch S1 is changed over when the alarm signal S202 from the comparator 22 of the remote detecting means 20 changes from the L signal to the H signal, and feeds an output of the output voltage detecting portion 11 to the error amplifying portion 5. The second analog switch S2 feeds normally the reference voltage of the first reference voltage generating portion 6 to the error amplifying portion 5. The second analog switch S2 is changed over when the alarm signal S202 from the remote detecting means 20 changes from the L signal to the H signal, and feeds the reference voltage of the second reference voltage generating portion 12 to the error amplifying portion 5. The third analog switch S3 feeds normally a signal from the second overvoltage protecting portion 13 to the oscillating portion 8. The third analog switch S3 is changed over when the alarm signal S202 from the remote detecting means 20 changes from the L signal to the H signal, and feeds a signal from the first overvoltage protecting portion 9 to the oscillating portion 8.

The reference voltage of the second voltage generating portion 12 is set higher than the reference voltage of the first voltage generating portion 6, because the switching power supply is so constructed as to operate based on the output from the rectifying and smoothing portion 3 when the detecting lead L3 or L4 of the load L connected to the remote detecting terminals T3 or T4 is disconnected, and because the output voltage of the rectifying and smoothing portion 3 is higher than the voltage between the terminals of the load L by the voltage drop through the distribution wires L1, L2. The reference voltage of the second reference voltage generating portion 12 is set higher than the reference voltage of the first reference voltage generating portion 6 by the voltage drop through the distribution wires L1, L2.

When the detecting leads L3, L4 of the load L connected to the remote detecting terminals T3, T4 of the remote detecting means 20 are not disconnected, since the alarm signal S202 from the remote detection means 20 is the L signal, the switching power supply of FIG. 3 operates in the similar way as the switching power supply of FIG. 1 except that the first analog switch S1 is connected to the output side of the differential amplifier 21 of the remote detecting means 20; the second analog switch S2 is connected to the side of the first reference voltage generating portion 6; the third analog switch S3 is connected to the side of the second overvoltage protecting portion 13; and protection from overvoltage is conducted by the third analog switch S3 based on the voltage applied between the terminals of the load L.

When the detecting lead L3 or L4 of the load L connected to the remote detecting terminals T3 or T4 of the remote detecting means 20 is disconnected, the alarm signal S202 (H signal) is outputted from the remote detecting means 20, and the first through third analog switches S1 though S3 are changed over. Therefore, the switching power supply starts to operate based on the output voltage of the rectifying and smoothing portion 3, and in association with this, the reference voltage fed to the error amplifying portion 5 and the voltage for overvoltage protection fed to the oscillating portion 8 are changed over to the voltages higher than the normal voltages by the voltage drop through the distribution wires L1, L2.

According to the present invention, the switching power supply is provided with the remote detecting means, which is formed of the differential amplifier having the inverse terminal and the non-inverse terminal connected to each of the remote detecting terminals, and the output terminal connected to the control means; and the comparator for comparing an output of the differential amplifier with a reference voltage and for outputting an alarm signal when the output of the differential amplifier is lower than the reference voltage. Therefore, the remote detecting means can detect disconnection of the detecting lead of the load to the remote detecting terminal, and output an alarm signal.

According to the present invention, the switching power supply is provided also with the first, second and third switching means changed over by an alarm signal outputted from the remote detecting means in addition to the remote detecting means. The first switching means normally feeds the output of the differential amplifier to the control means, and is changed over by the alarm signal to feed an output of the output detecting means for detecting the output voltage of the rectifying and smoothing portion to the control means. The second switching means normally feeds the first reference voltage to the control means, and is changed over by the alarm signal to feed the second reference voltage to the control means. The third switching means normally feeds an output of the second overvoltage protecting means to the control means, and is changed over by the alarm signal to feed an output of the first overvoltage protecting means to the control means. This switching power supply detects disconnection of the detecting lead of the load to the remote detecting terminal.

When the detecting lead is disconnected, the switching power supply continues to supply power to the load based on the output voltage of the rectifying and smoothing means, and changes to the reference voltage considering the voltage drop through the distribution wires connected to the load disposed away from the switching power supply. Thus, when the connection of the load to the remote detecting terminals is interrupted, it is possible to provide power to the load at the normal value and to continue to protect the overvoltage by the output at the rectifying and smoothing means.

What is claimed is:

1. A switching power supply for supplying electric current to a load located away from the switching power supply, comprising:

a transformer;

switching means for switching on and off an electric current of a direct current source supplied thereto, an electric current switched on and off by the switching means being supplied to said transformer;

rectifying and smoothing means for rectifying and smoothing an electric current from said transformer, an output of the rectifying and smoothing means being supplied to terminals of the load;

remote detecting terminals connected to the terminals of the load;

remote detecting means connected to the remote detecting terminals for detecting a voltage between the terminals of the load, said remote detecting means including a differential amplifier with an output terminal, and a comparator connected to the output terminal of the differential amplifier, said differential amplifier having an inverse terminal and a non-inverse terminal connected to said remote detecting terminals, said comparator comparing an output voltage of said differential amplifier with a reference voltage and outputting an alarm signal when the output voltage of said differential amplifier is lower than the reference voltage;

reference voltage supply means for supplying a first reference voltage;

control means connected to the switching means, the output terminal of the differential amplifier and the reference voltage supply means, said control means changing ON-OFF duty ratio of the switching means by comparing the output voltage of said differential amplifier of the remote detecting means with the first reference voltage to control an output voltage of said switching means at a predetermined value; and overvoltage protecting means connected to the control means for protecting said load from overvoltage by monitoring the output of said rectifying and smoothing means.

2. A switching power supply according to claim 1, wherein said remote detecting means includes a first resistor connected to the inverse terminal, and the inverse terminal receives a power from a power supply through a second resistor.

3. A switching power supply according to claim 2, wherein said remote detecting means includes a third resistor connected to the non-inverse terminal, and fourth and fifth resistors, one end of the fourth resistor being connected to an input side of the third resistor, one end of the fifth resistor being connected to an output side of the third resistor, the other ends of the fourth and fifth resistors being grounded.

4. A switching power supply according to claim 3, wherein said control means is formed of error amplifying means connected to the output terminal of the differential amplifier and the reference voltage supply means, comparing means connected to the error amplifying means, and oscillating means connected to the comparing means and the overvoltage protecting means, said oscillating means changing the ON-OFF duty ratio of the switching means.

5. A switching power supply for supplying electric current to a load located away from the switching power supply, comprising:

a transformer;

main switching means for switching on and off an electric current of a direct current source supplied thereto, an electric current switched on and off by the main switching means being supplied to said transformer;

rectifying and smoothing means for rectifying and smoothing an electric current from said transformer, an output of the rectifying and smoothing means being supplied to terminals of the load;

remote detecting terminals connected to the terminals of the load;

remote detecting means connected to the remote detecting terminals for detecting a voltage between the terminals of the load, said remote detecting means including a differential amplifier with an output terminal, and a comparator connected to the output terminal of the differential amplifier, said differential amplifier having an inverse terminal and a non-inverse terminal connected to said remote detecting terminals, said comparator comparing an output voltage of said differential amplifier with a reference voltage and outputting an alarm signal when the output voltage of said differential amplifier is lower than the reference voltage;

first reference voltage supply means for supplying a first reference voltage;

control means connected to the main switching means for changing ON-OFF duty ratio of the main switching means by comparing the output voltage of said differential amplifier of the remote detecting means with the first reference voltage to control an output voltage of said main switching means at a predetermined value;

first overvoltage protecting means to be connected to the control means for protecting said load from overvoltage by monitoring the output of said rectifying and smoothing means;

output voltage detecting means connected to the rectifying and smoothing means for detecting the output of the rectifying and smoothing means;

second reference voltage generating means for outputting a second reference voltage higher than the first reference voltage;

second overvoltage protecting means connected to the remote detecting terminal; and first, second and third switching means electrically connected to the remote detecting means to be changed over by the alarm signal outputted from the remote detecting means;

said first switching means normally feeding the output voltage of the differential amplifier to the control means and being changed over by the alarm signal to feed an output of said output voltage detecting means to said control means;

said second switching means normally feeding the first reference voltage to said control means and being changed over by the alarm signal to feed the second reference voltage to said control means; and said third switching means normally feeding an output of said second overvoltage protecting means to said control means and being changed over by the alarm signal to feed an output of said first overvoltage protecting means to said control means.

6. A switching power supply according to claim 5, wherein said control means is formed of error amplifying means connected to output terminals of the first and second switching means, comparing means connected to the error amplifying means, and oscillating means connected to the comparing means and an output of the third switching means, said oscillating means changing the ON-OFF duty ratio of the main switching means.

* * * * *